(12) United States Patent
Chiu

(10) Patent No.: US 6,787,388 B1
(45) Date of Patent: Sep. 7, 2004

(54) SURFACE MOUNT PACKAGE WITH INTEGRAL ELECTRO-STATIC CHARGE DISSIPATING RING USING LEAD FRAME AS ESD DEVICE

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 200 days.

(21) Appl. No.: 09/656,984

(22) Filed: Sep. 7, 2000

(51) Int. Cl.[7] .......................... H01L 21/44; H01L 21/48; H01L 21/50
(52) U.S. Cl. .................. 438/106; 438/111; 438/127
(58) Field of Search .................. 438/106, 111, 438/112, 123, 124, 126, 127, FOR 379, FOR 380; 257/666, 684, 692, 696; 382/124

(56) References Cited

U.S. PATENT DOCUMENTS

| | | | | |
|---|---|---|---|---|
| 5,773,876 A | * | 6/1998 | Mekdhanasarn et al. | 257/665 |
| 5,835,988 A | * | 11/1998 | Ishii | 257/684 |
| 5,862,248 A | | 1/1999 | Salatino et al. | 382/124 |
| 5,914,529 A | * | 6/1999 | King et al. | 257/666 |
| 5,994,169 A | * | 11/1999 | Lamson et al. | 438/123 |
| 6,090,644 A | * | 7/2000 | Moden | 438/127 |
| 6,165,818 A | * | 12/2000 | Ichikawa et al. | 438/123 |
| 6,307,258 B1 | * | 10/2001 | Crane, Jr. et al. | 257/680 |
| 2002/0027268 A1 | * | 3/2002 | Tanaka et al. | 257/666 |

* cited by examiner

Primary Examiner—W. David Coleman
Assistant Examiner—Khiem Nguyen
(74) Attorney, Agent, or Firm—William A. Munck; Lisa K. Jorgenson

(57) ABSTRACT

In a packaged integrated circuit, electrostatic discharge protection is provided by portions of a lead frame on which the integrated circuit is mounted. The lead frame includes a die paddle on which an integrated circuit die is mounted, with plastic or epoxy material encapsulating exposed surfaces of the integrated circuit die except for a sensing surface, and supporting pins or leads formed from the lead frame. Portions of the lead frame extending from the die paddle are folded around sides of the encapsulated integrated circuit die and over, or adjacent to and level with, a peripheral upper surface of the encapsulated integrated circuit die to form an electrostatic discharge ring. The lead frame portions folded around the integrated circuit package are connected to ground through a ground pin, so that charge on a human finger touching the electrostatic discharge ring is dissipated to ground before the finger contacts a sensing surface of the integrated circuit. The portions of the lead frame which are folded around the encapsulated integrated circuit die may extend only around sides or side regions of the integrated circuit package not including pins or leads or, alternatively, may extend around all sides of the integrated circuit package and have openings where side regions of the integrated circuit package includes pins or leads.

20 Claims, 7 Drawing Sheets

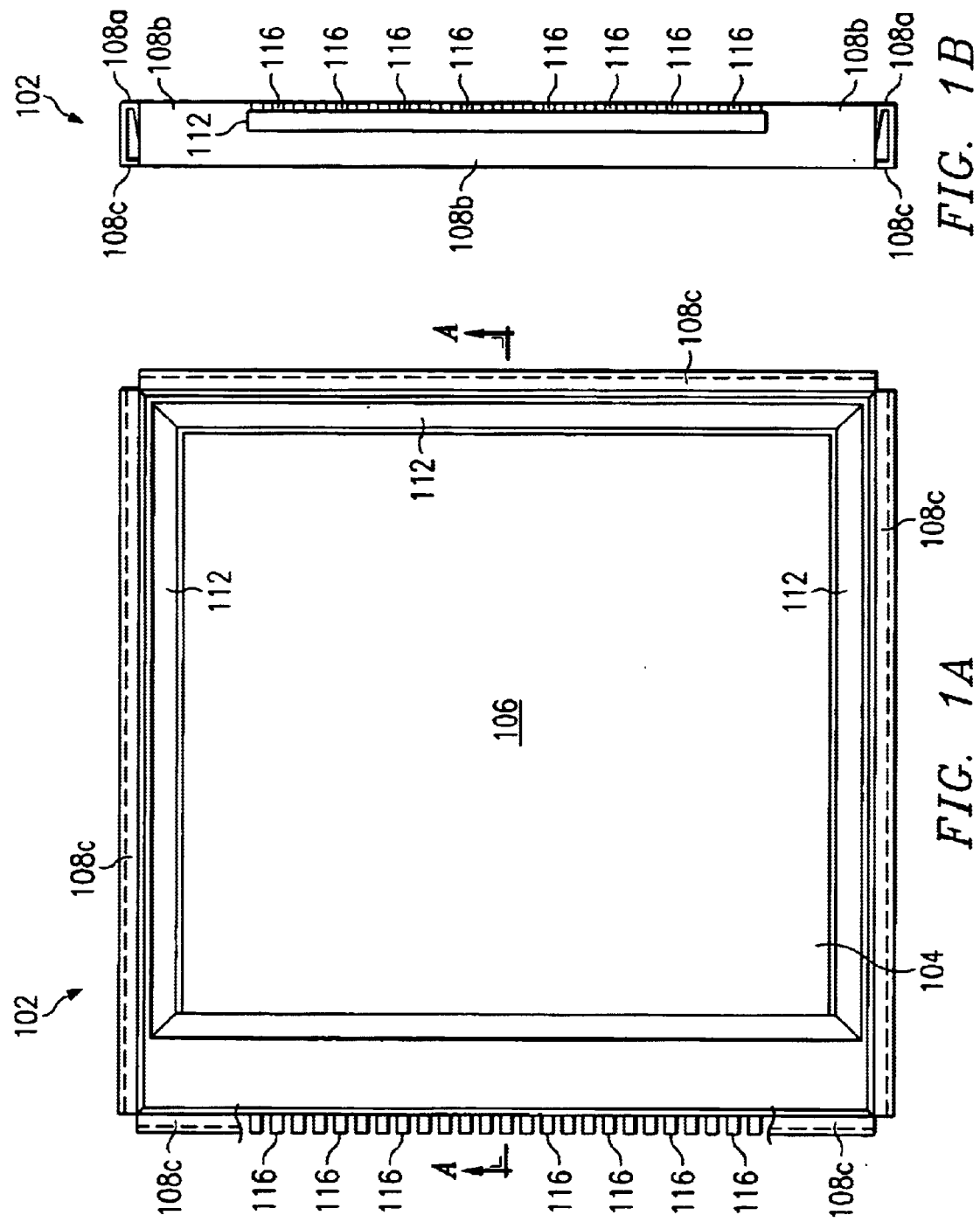

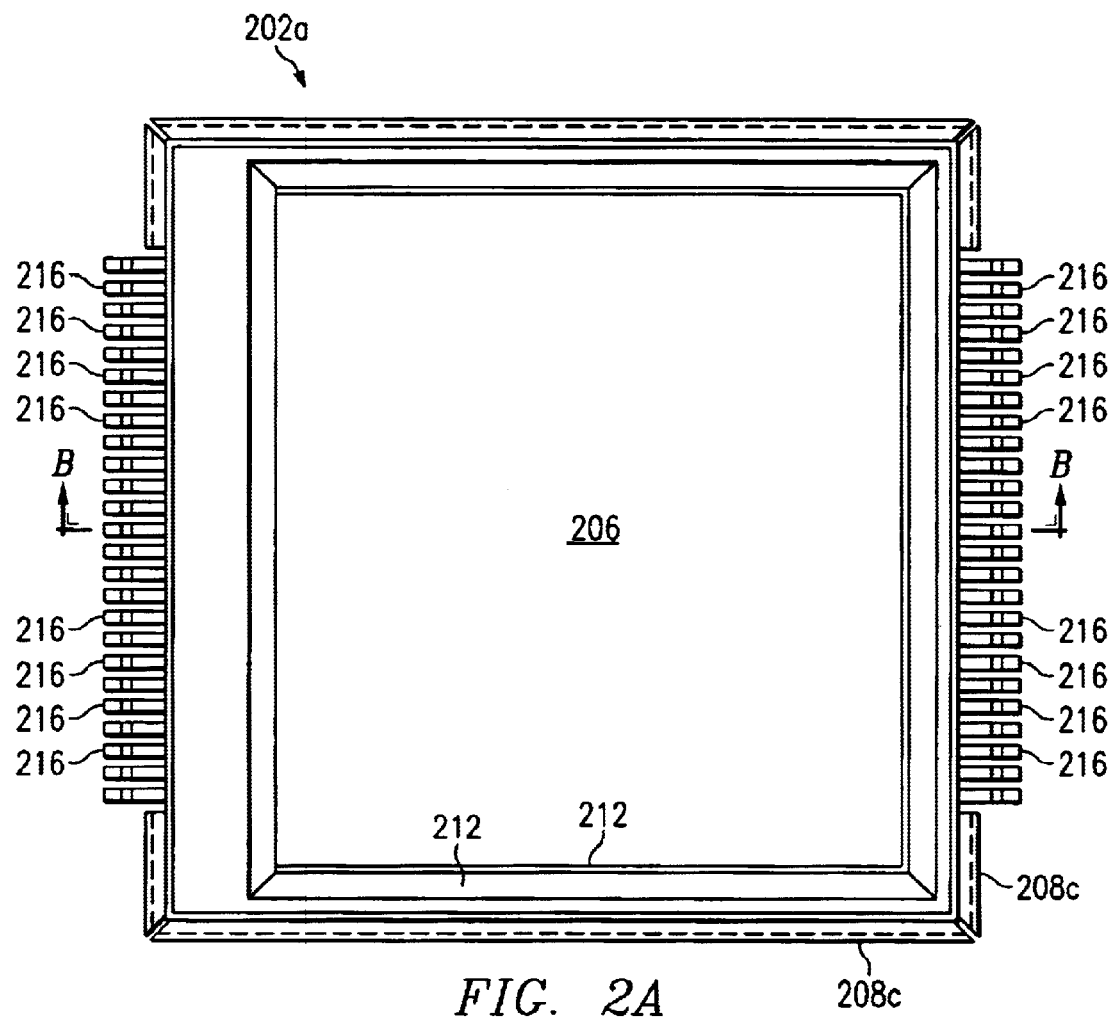
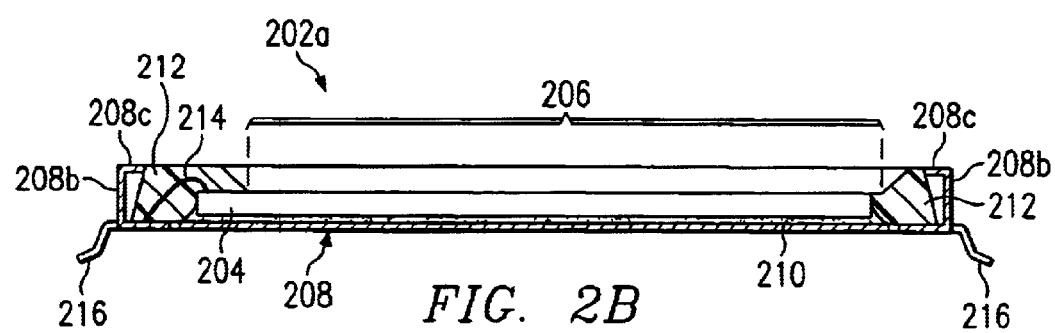

SURFACE MOUNT PACKAGE WITH INTEGRAL ELECTRO-STATIC CHARGE DISSIPATING RING USING LEAD FRAME AS ESD DEVICE

BACKGROUND OF THE INVENTION

1. Field of the Invention

The present invention relates generally to packaging integrated circuit devices and in particular to providing electrical discharge properties to integrated circuit device packaging. Still more particularly, the present invention relates to forming a metal ring around an integrated circuit from a portion of a lead frame for the purpose of conducting electro-static energy away from the integrated circuit.

2. Description of the Prior Art

In conventional integrated circuits, electrostatic discharge (ESD) events typically enter the circuitry through the pad ring, which dissipates the charge before reaching the core. Some recently developed integrated circuits, however, must necessarily expose the core of the circuitry to ESD events. Contemporary fingerprint sensors, for example, often include a two-dimensional array of sensing electrodes proximate to a sensing surface on which the finger is placed, with ridges and valleys on the finger skin detected by capacitance variations caused by the varying distance between the skin surface and the sensor electrodes. The need for contact with the finger in order to detect fingerprint features necessitates exposure of the integrated circuit to electrostatic discharge events resulting from a finger touching the sensing surface.

The electrostatic charge which may be carried by a human body oftens fall within the range of several kilovolts or more. Typical electrostatic discharge protection circuits have proven somewhat ineffective in safely dissipating such charges, which may provide sufficient energy to break through upper dielectric/passivation layer.

Additionally, integrated circuits which cannot be completely encapsulated—except for conductive leads to the circuit—during packaging (e.g., fingerprint sensors, optical sensors, and other circuit requiring that a portion of the integrated circuit remain exposed) are typically mounted utilizing "Chip On Board" technology. The integrated circuits are mounted on a printed circuit board in an unencapsulated form, connected to the printed circuit board through the bond wires, then protected utilizing liquid encapsulation or silicon gel. Such mounting, which involves the use of gold plating of the substrate, is much more expensive than conventional surface mounting of integrated circuits on a stamped lead frame. However, viable surface mounting of fingerprint sensors on lead frames has not yet been achieved.

It would be desirable, therefore, to provide a technique for surface mounting of fingerprint sensors on lead frames while providing adequate electrostatic discharge protection to the packaged integrated circuit.

SUMMARY OF THE INVENTION

In a packaged integrated circuit, electrostatic discharge protection is provided by portions of a lead frame on which the integrated circuit is mounted. The lead frame includes a die paddle on which an integrated circuit die is mounted, with plastic or epoxy material encapsulating exposed surfaces of the integrated circuit die except for a sensing surface, and supporting pins or leads formed from the lead frame. Portions of the lead frame extending from the die paddle are folded around sides of the encapsulated integrated circuit die and over, or adjacent to and level with, a peripheral upper surface of the encapsulated integrated circuit die to form an electrostatic discharge ring. The lead frame portions folded around the integrated circuit package are connected to ground through a ground pin, so that charge on a human finger touching the electrostatic discharge ring is dissipated to ground before the finger contacts a sensing surface of the integrated circuit. The portions of the lead frame which are folded around the encapsulated integrated circuit die may extend only around sides or side regions of the integrated circuit package not including pins or leads or, alternatively, may extend around all sides of the integrated circuit package and have openings where side regions of the integrated circuit by package includes pins or leads.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1A–1E depict various views of a packaged surface mount integrated circuit having an integral electrostatic discharge ring formed from lead frame portions in accordance with a preferred embodiment of the present invention;

FIGS. 2A–2D are various views of alternative designs for a packaged surface mount integrated circuit having an integral electrostatic discharge ring formed from lead frame portions in accordance with a preferred embodiment of the present invention;

DETAILED DESCRIPTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuit packages. The present invention can be practiced in conjunction with integrated circuit package fabrication techniques currently used in the art, and only so much of the commonly practiced process steps are included as are necessary for an understanding of the present invention. The figures showing portions of an integrated circuit package during fabrication are not necessarily drawn to scale, but instead are drawn so as to illustrate the important features of the invention.

Figure 1C:
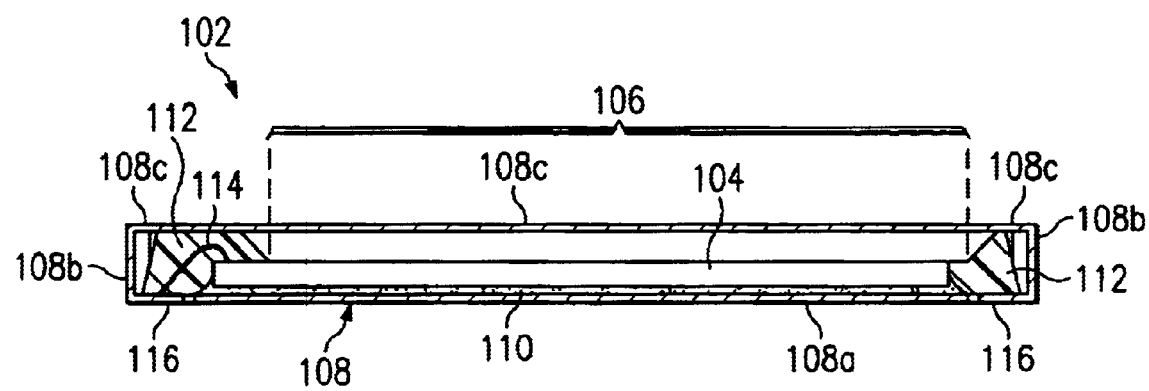
Figure 1D:
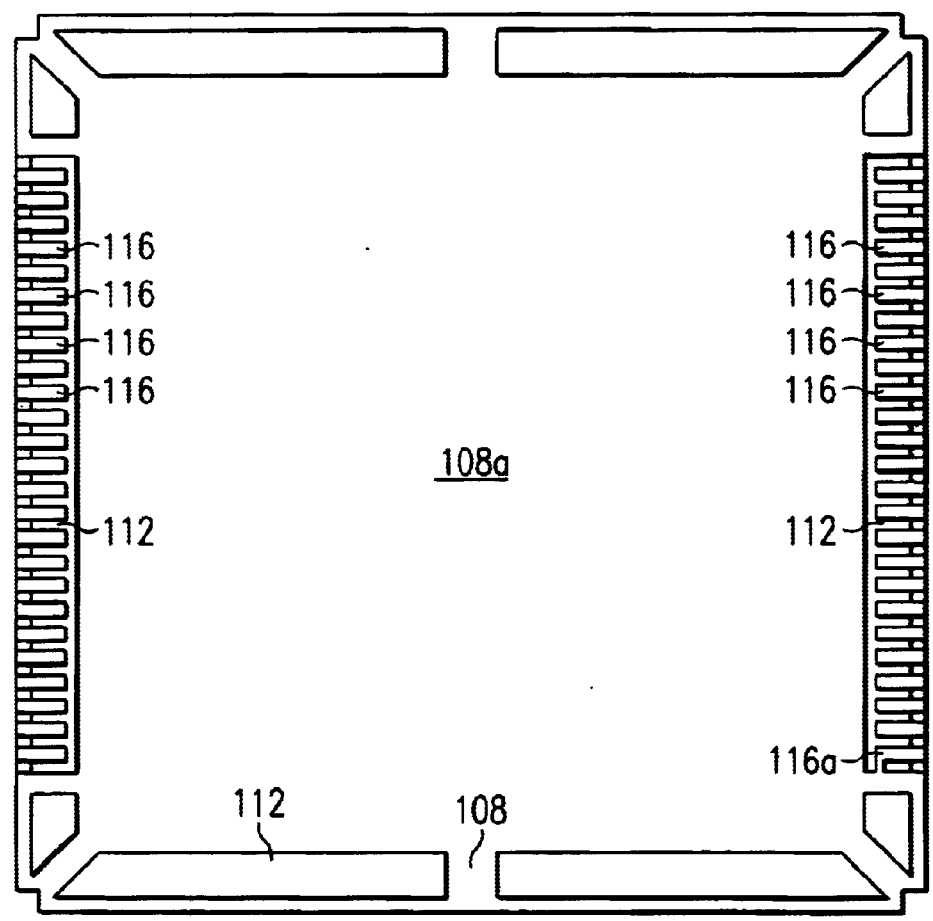
Figure 1E:
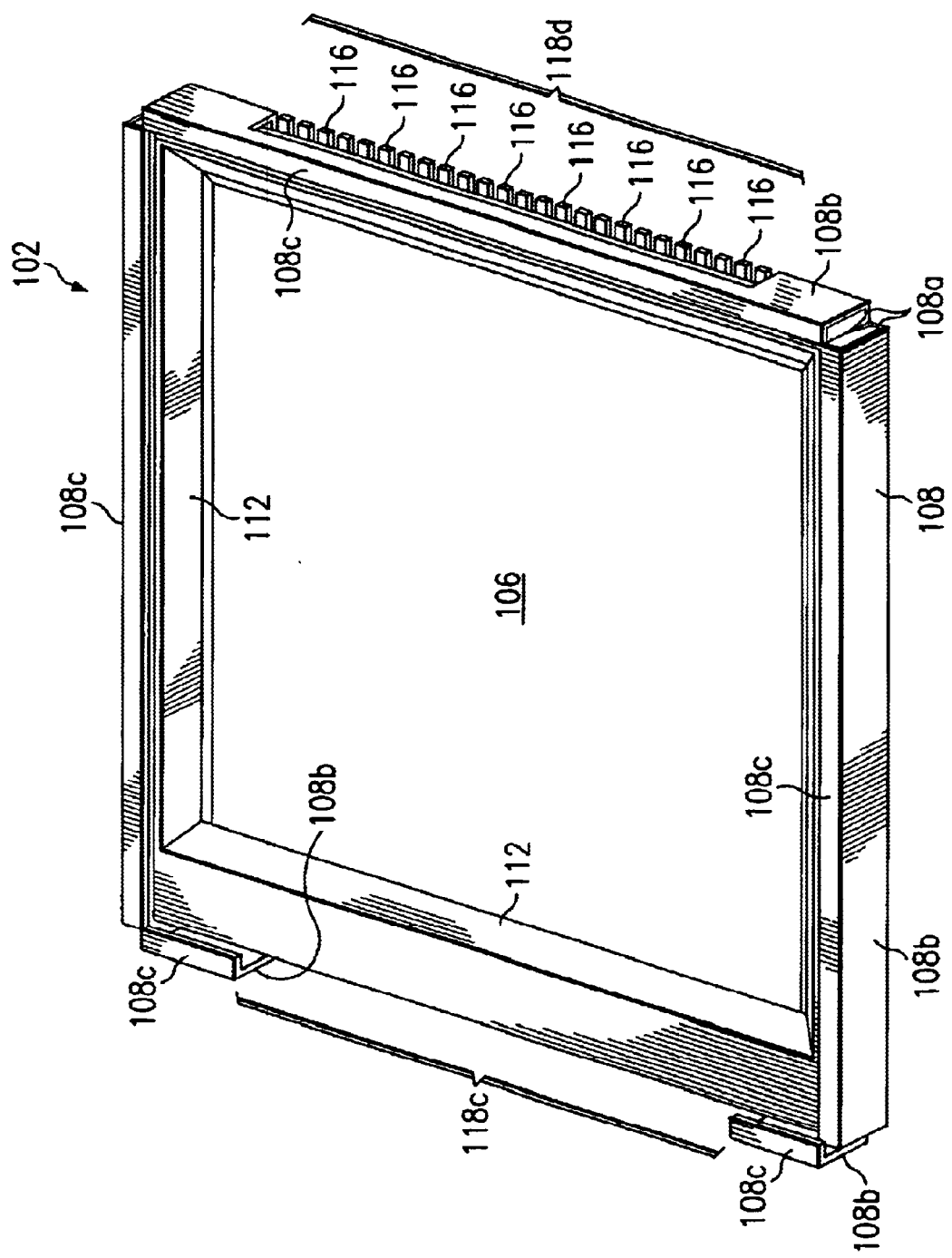

With reference now to the figures, and in particular with reference to FIGS. 1A through 1E, various views of a packaged surface mount integrated circuit having an integral electrostatic discharge ring formed from a lead frame portion in accordance with a preferred embodiment of the present invention are depicted. FIG. 1A depicts a plan view of the integrated circuit package 102, while FIG. 1B depicts a side view, FIG. 1C depicts a cross-sectional view taken at section lines A—A, FIG. 1D depicts a back or bottom view, and FIG. 1E depicts an isometric view. Packaged integrated circuit 102 in the exemplary embodiment includes an fingerprint sensor integrated circuit die 104 having a sensing surface 106 proximate to an array of sensor electrodes. A finger is placed on sensing surface 106 of packaged integrated circuit 102 in order to detect the fingerprint; accordingly, sensing surface 106 must remain exposed and should not be encapsulated.

Integrated circuit die 104 is mounted on a stamped metal lead frame 108, affixed to lead frame 108 by an adhesive 110. A peripheral portion of the integrated circuit die 104, not including sensing surface 106, is encapsulated in a plastic or epoxy material 112 protecting the integrated circuit and wire bonds 114, connecting the integrated circuit die 104 to pins 116 formed from a portion of the lead frame 108. Plastic or epoxy material 112 is formed by molding in accordance with the known art. A lead frame strip having several lead frames, each bearing an integrated circuit die and wire bonds connecting the integrated circuit die to the respective lead frame, is mounted on the mold with the integrated circuit die and wire bonds received by a mold cavity. The mold cavity includes surfaces contacting the sensing surface 106 of each integrated circuit die to prevent plastic or epoxy encapsulating material from adhering to the sensing surface. Plastic or epoxy material is then formed to encapsulate portions of the integrated circuit die not contacted by the mold surface, the wire bonds, and the surfaces of the lead frame overlying the mold cavity.

Also formed from a portion of lead frame 108 is an electrostatic discharge ring. The electrostatic discharge ring is formed by folding a portion of the lead frame 108 from the bottom of integrated circuit die 104 and plastic or epoxy material 112 up around the sides and over a peripheral portion of the top surface. Lead frame 108 is stamped with portions preformed for folding over the sides and top during lead frame trim and form operations.

After packaging is completed, lead frame 108 includes a first portion 108a underlying the integrated circuit die 104, plastic or epoxy material 112, and bond wires 114. Much of first portion 108a comprises a die paddle to which the integrated circuit die is affixed. Second portions 108b along the sides of the integrated circuit package 102, and third portions 108c overlying a peripheral portion of an upper surface of integrated circuit package 102. (Part of the overlying peripheral portion 108c is depicted as brokenaway on the left side of FIG. 1A to depict pins 114). Pins 116 are also formed from portions of the stamped lead frame 108, but are, for the most part, separated from lead frame 108 during packaging trim and form operations and are held in place by plastic or epoxy material 112. At least one pin 116a (best seen in FIG. 1D) remains connected to lead frame 108, serving as a ground connection for the electrostatic discharge ring. The remaining pins are, after fabrication of integrated circuit package 102 is complete, electrically and physically isolated from lead frame 108 and pin 116a, and may instead be electrically connected to the integrated circuit die 104 via bond wires 114.

As illustrated in FIG. 1E, the electrostatic discharge ring formed by the folded portions of lead frame 108b and 108c may extend along a side of packaged integrated circuit 102 from which pins 116 project, with an opening 118d through the folded lead frame portions 108b and 108c allowing access to pins 116 for an external connector as depicted on the right side of FIG. 1E. Alternatively, the electrostatic discharge ring may contain a broken region 118e along a side from which pins 116 project. The required length of the pins which must remain exposed for a connector, the thickness of the integrated circuit 104 and plastic or epoxy material 112, and other design considerations may affect whether the electrostatic discharge ring extends along a complete circumference of the packaged integrated circuit 102.

Referring to FIGS. 2A through 2D, various views of alternative designs for a packaged surface mount integrated circuit having an integral electrostatic discharge ring formed from lead frame portions in accordance with a preferred embodiment of the present invention are illustrated. While the embodiment of FIG. 1A through 1E included straight pins for connection of the packaged integrated circuit to an external connector receiving the pins, the embodiments of FIGS. 2A through 2D include gull wing leads for mounting the packaged integrated circuit on a printed circuit board with soldered connections.

FIG. 2A is a plan view of one alternative embodiment of a packaged surface mount integrated circuit having an integral electrostatic discharge ring formed from lead frame portions, while FIG. 2B is a cross-sectional view of the same alternative embodiment taken at section lines B—B. Packaged integrated circuit 202a includes an integrated circuit die 204 containing sensor circuitry and including a sensor surface 206. Integrated circuit die 204 is affixed on a bottom surface to lead frame 208 by an adhesive 210, and is partially encapsulated on remaining surfaces by a plastic or epoxy material 212, but not over sensing surface 206. Plastic or epoxy material 212 also encapsulates bond wires 214 electrically connecting the integrated circuit die 204 to the leads 216.

While the embodiment of FIGS. 1A through 1E included (or could have included) an electrostatic discharge ring along an entire circumference of an upper peripheral edge of the packaged integrated circuit, the length of lead frame material required to form gull wing leads 216 and the thin dimension of the packaged integrated circuit in the embodiment of FIGS. 2A through 2D prevents the electrostatic discharge ring from extending all the way around the packaged integrated circuit 202a. Nonetheless, portions 208b and 208c of the lead frame 208 are folded up around the sides and over a peripheral top portion of packaged integrated circuit 202a wherever possible to form an incomplete "ring" connected to ground and dissipating electrostatic charge when contacted by a human finger.

Figure 2C:
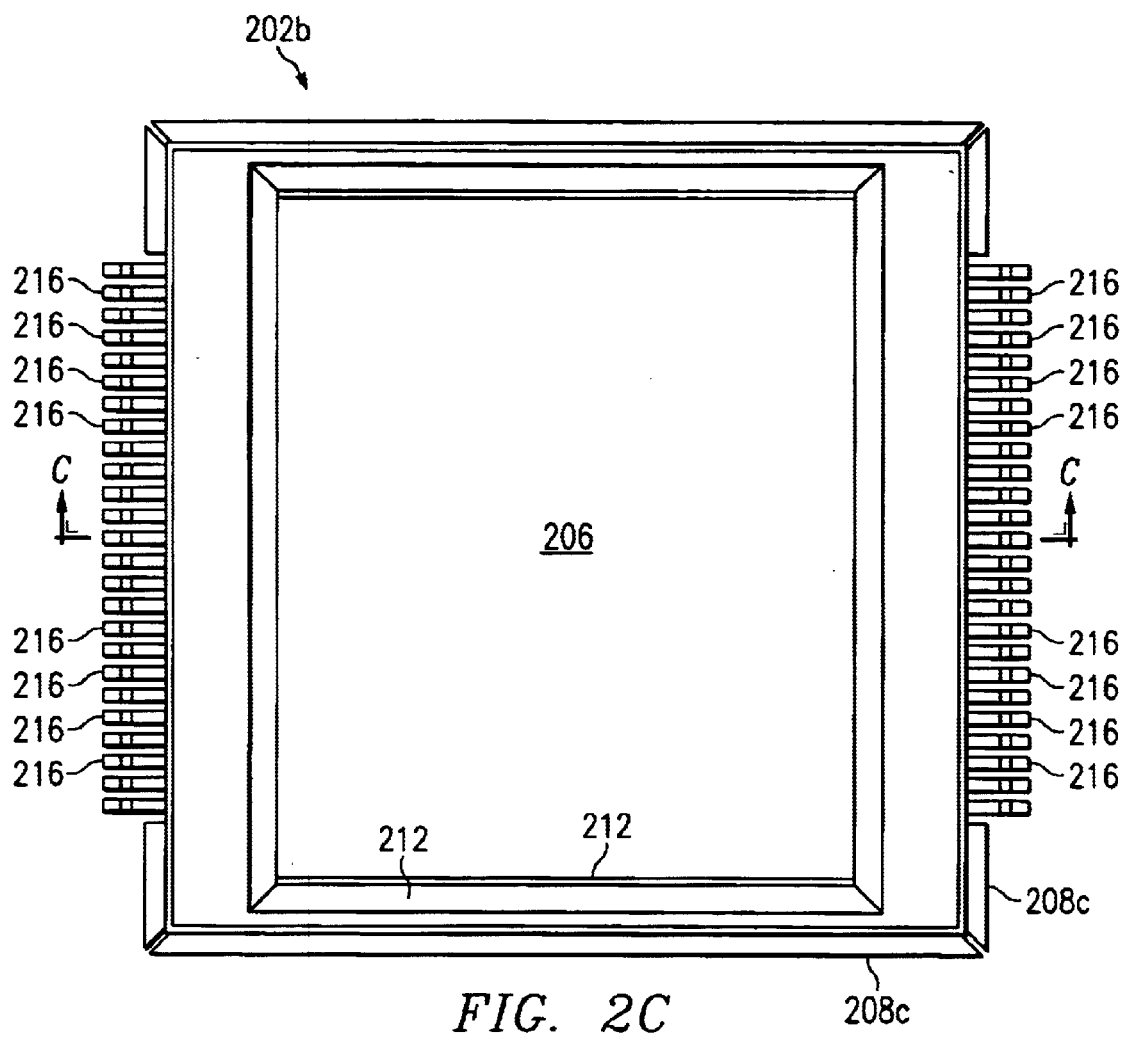
Figure 2D:
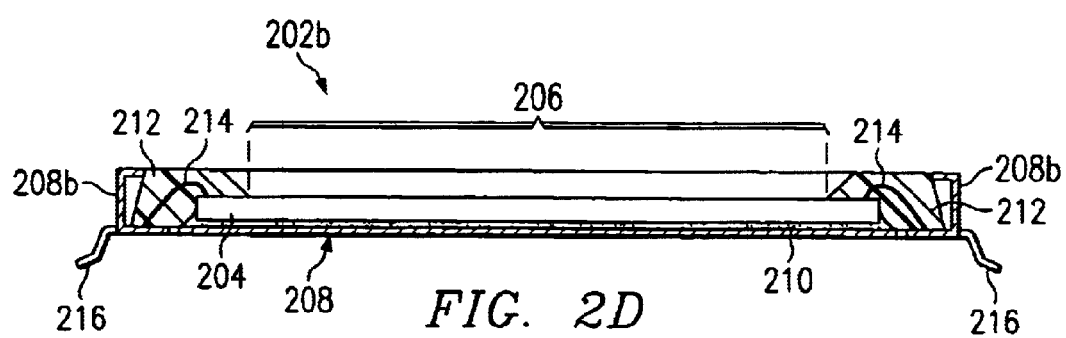

FIG. 2C is a plan view of another alternative embodiment of a packaged surface mount integrated circuit having an integral electrostatic discharge ring formed from lead frame portions, while FIG. 2D is a cross-sectional view of that alternative embodiment taken at section lines C—C. While the embodiment shown in FIGS. 2A and 2B includes wire bonds 214 within plastic or epoxy material 212 on only one side, the packaged integrated circuit 202b of FIGS. 2C and 2D includes bond wires 214 encapsulated by plastic or epoxy material 212 on both sides. Either structure may be formed in the present invention.

Figure 3A:
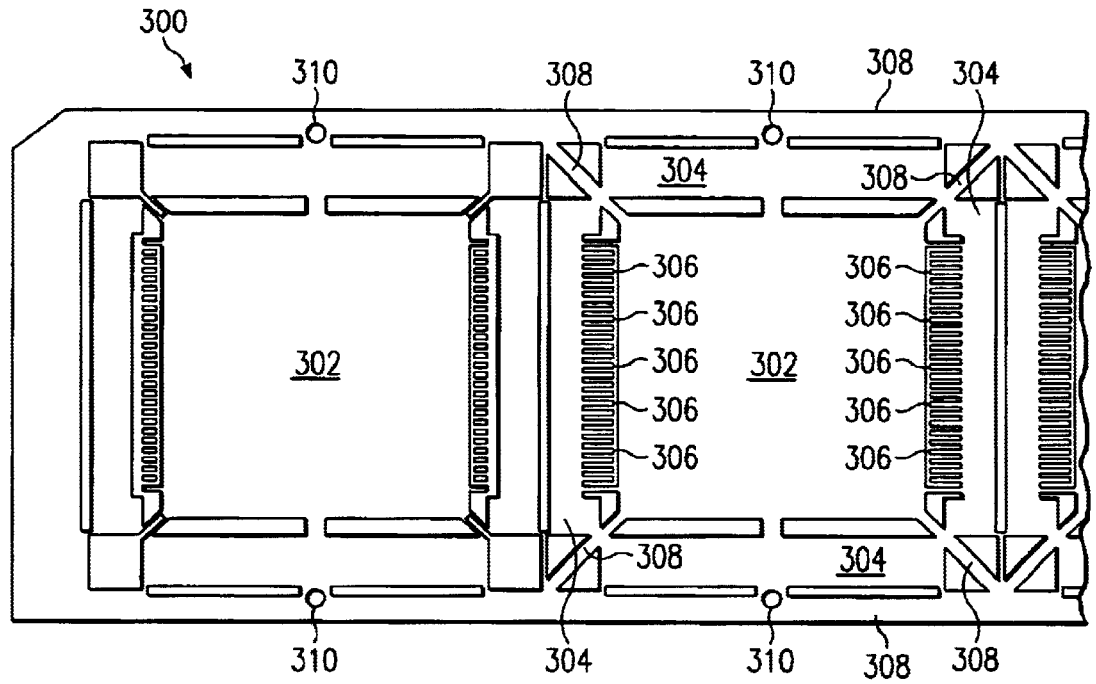
FIGS. 3A–3B depict plan views of lead frame strips utilized in forming a packaged surface mount integrated circuit having an integral electrostatic discharge ring formed from lead frame portions in accordance with a preferred embodiment of the present invention.
Figure 3B:
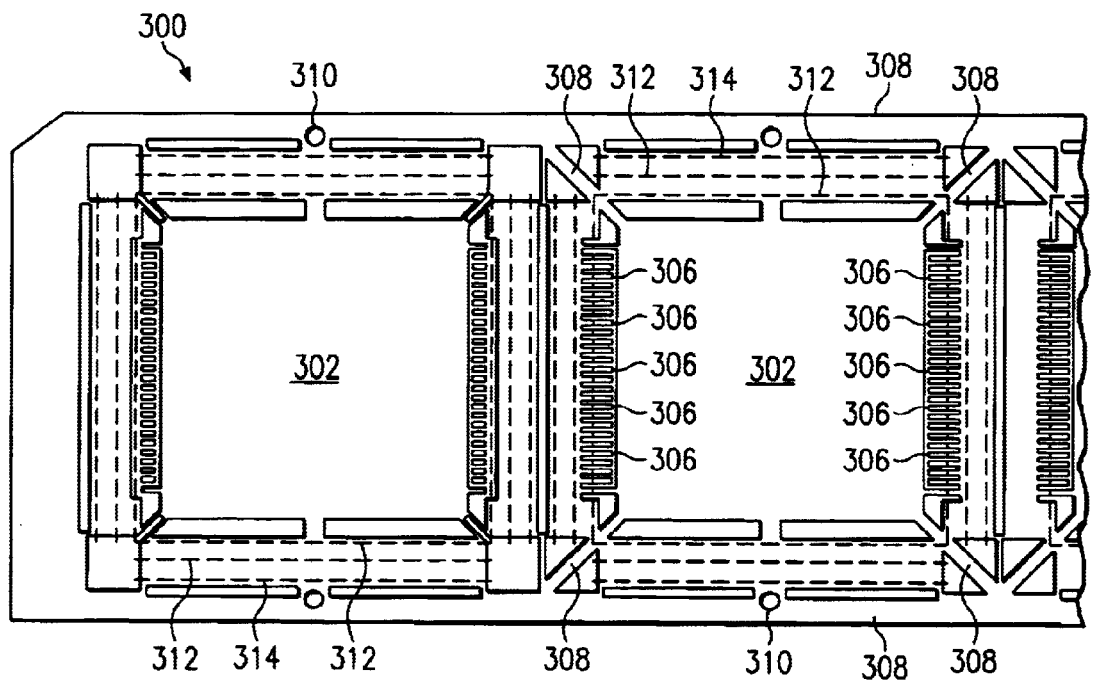

With reference now to FIGS. 3A and 3B, plan views of lead frame strips utilized in forming a packaged surface mount integrated circuit having an integral electrostatic discharge ring formed from lead frame portions in accordance with a preferred embodiment of the present invention are depicted.

The uncut lead frame strip 300 depicted in both FIG. 3A and 3B contains a plurality of lead frames with integral electro-static discharge ring portions for packaging integrated circuits. Each lead frame includes a die paddle 302 to which the integrated circuit die is affixed. Sections 304 of the lead frame will form the electrostatic discharge ring after being folded up around the sides and over an upper peripheral portion of the integrated circuit structure being packaged by the lead frame.

Other portions 306 of the lead frame will form the pins or leads of the finished integrated circuit package and will be separated from the remainder of the lead frame during trim and form operations, except for one or more pins or leads providing a grounding connection to the lead frame and electrostatic discharge ring. The pins or leads formed from portions 306 will be held in place by plastic or epoxy encapsulating material molded around at least parts of the integrated circuit die mounted on the leadframe, and will be electrically connected to the integrated circuit by bond wires within the plastic or epoxy encapsulating material. Shorting bars 308, containing "tooling" or alignment holes 310, provide structural support for the lead frame and will be removed during lead frame trim and form operations.

During lead frame trim and form operations, sections of each lead frames will be folded along the dashed fold lines 312 and trimmed along dashed trim lines 314 depicted in FIG. 3B. These sections will be folded up around the sides and over a peripheral upper surface of the integrated circuit package to form the electrostatic discharge ring. These sections remain physically and electrically connected to the lead frame die paddle on which the integrated circuit die is mounted, and are connected through the lead frame to a grounding connection. When a human finger touches the electrostatic discharge ring formed from these folded section in contacting the sensing surface of the packaged integrated circuit, any electrostatic charge is dissipated to ground by the electrostatic discharge ring.

Figure 4A:
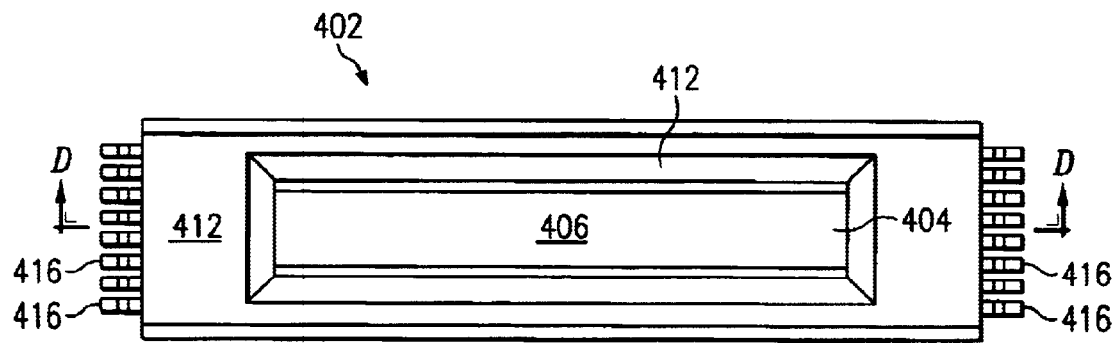
FIGS. 4A–4C are various views of a narrow-strip packaged integrated circuit with gull-wing leads and an integral electrostatic discharge ring formed from lead frame portions in accordance with a preferred embodiment of the present invention.
Figure 4B:
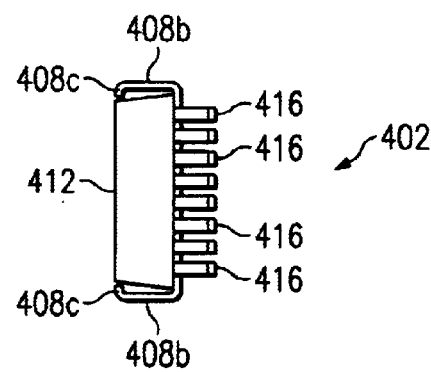
Figure 4C:
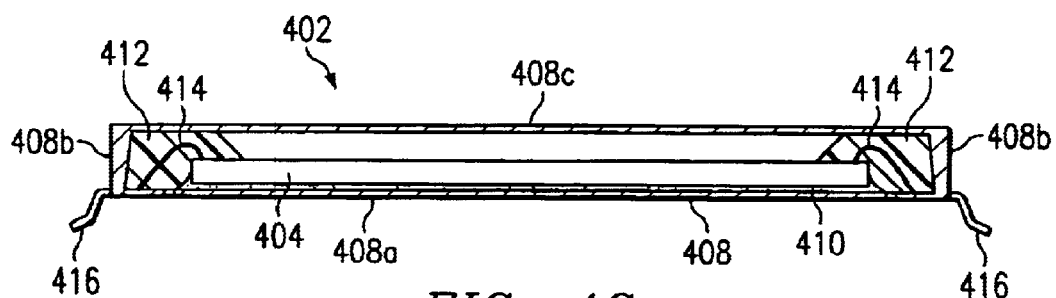

Referring to FIGS. 4A—4C, various views of a narrow-strip packaged integrated circuit with gull-wing leads and an integral electrostatic discharge ring formed from lead frame portions in accordance with a preferred embodiment of the present invention are illustrated. FIG. 4A shows a plan view of narrow-strip packaged integrated circuit 402, while FIG. 4B shows a side view and FIG. 4C shows a cross-sectional view taken at section lines D—D. Packaged integrated circuit 402 includes an integrated circuit die 404 having a sensing surface 406 mounted on a lead frame 408 with an adhesive 410. Plastic or epoxy material 412 encapsulates portions of integrated circuit die 404 other than sensing surface 406 and wire bonds 414 connecting integrated circuit die 404 to leads 416. Leads 416 are formed from portions of lead frame 408, but are separated from lead frame 408 during lead frame trim and form operations, except for one lead providing a grounding connection for lead frame 408 and the electrostatic discharge ring.

Portions 408b and 408c of the lead frame 408 projecting from a bottom portion 408a are folded up around the sides of the package (portions 408c) and bent over to be level with an upper surface of plastic or epoxy material 412. These portions 408b and 408c form an electrostatic discharge "ring" for packaged integrated circuit 402 by providing a low resistance path to ground. Because of the narrowness of the package and the required length of leads 416, the electrostatic discharge "ring" is formed only along the long edges of package 402, and not on the ends. However, the portions 408b and 408c of lead frame 408 which form the electrostatic discharge protection are close enough to the exposed sensing surface of the packaged integrated circuit to be contacted when a finger touches the sensing surface.

In the present invention, an electrostatic discharge ring for packaged integrated circuits is integrally formed from a portion functions by creating a path for accumulated electric charge to flow from the human finger or other item touching the packaged device to ground. Because the electrostatic discharge ring presents a low resistance path relative to the sensor area and the packaging materials, the electrostatic discharge ring serves as the preferred path from a region of high charge to a grounded region. Therefore, when a user of the sensor touches the sensor area, the user's finger will contact or come in close proximity with the electrostatic discharge ring, at which time any excess charge accumulated on the user will pass through the electrostatic discharge ring to ground, protecting the integrated circuit within the package.

While the invention has been particularly shown and described with reference to a preferred embodiment, it will be understood by those skilled in the art that various changes in form and detail may be made therein without departing from the spirit and scope of the invention.

What is claimed is:

1. A method of providing electrostatic discharge protection for an integrated circuit, comprising:

mounting an integrated circuit die on a lead frame including one or more leads or pins;

encapsulating at least part of the integrated circuit die and a portion of the lead frame with a plastic or epoxy material; and folding an unencapsulated portion of the lead frame other than the leads or pins around sides of the encapsulated integrated circuit die and over or adjacent to a peripheral upper surface of the plastic or epoxy material.

2. The method of claim 1, further comprising:

connecting the portion of the lead frame folded around the sides of the encapsulated integrated circuit die and over or adjacent to the peripheral upper surface of the plastic or epoxy material to a ground voltage.

3. The method of claim 1, wherein the step of encapsulating at least part of the integrated circuit die with a plastic or epoxy material further comprising:

after mounting the integrated circuit die on the lead frame, encapsulating exposed surfaces of the integrated circuit die except for a sensing surface; and encapsulating wire bonds connecting the integrated circuit die to portions of the lead frame connected to the leads.

4. The method of claim 1, wherein the step of folding a portion of the lead frame other than the leads or pins around sides of the encapsulated integrated circuit die and over or adjacent to a peripheral upper surface of the plastic or epoxy material further comprises:

folding portions of the lead frame other than the leads or pins around each side of the encapsulated integrated circuit die.

5. The method of claim 1, wherein the step of folding a portion of the lead frame other than the leads or pins around sides of the encapsulated integrated circuit die and over or adjacent to a peripheral upper surface of the plastic or epoxy material further comprises:

folding a first portion of the lead frame other than the leads or pins around a first side of the encapsulated integrated circuit die, wherein the first portion includes an opening providing access for a connector to pins electrically connected to the integrated circuit die.

6. The method of claim 1, wherein the step of folding a portion of the lead frame other than the leads or pins around sides of the encapsulated integrated circuit die and over or adjacent to a peripheral upper surface of the plastic or epoxy material further comprises:

folding portions of the lead frame other than the leads or pins only around edges of the encapsulated integrated circuit die not including leads electrically connected to the integrated circuit die.

7. The method of claim 1, wherein the step of folding a portion of the lead frame other than the leads or pins around sides of the encapsulated integrated circuit die and over or adjacent to a peripheral upper surface of the plastic or epoxy material further comprises:

folding a first portion of the lead frame other than the leads or pins around a side of the encapsulated integrated circuit die; and folding a second portion of the lead frame extending from the first portion over a peripheral upper surface of the encapsulated integrated circuit die.

8. The method of claim 1, wherein the step of folding a portion of the lead frame other than the leads or pins around sides of the encapsulated integrated circuit die and over or adjacent to a peripheral upper surface of the plastic or epoxy material further comprises:

folding a first portion of the lead frame other than the leads or pins around a side of the encapsulated integrated circuit die; and folding a second portion of the lead frame extending from the first portion adjacent to and level with a peripheral upper surface of the encapsulated integrated circuit die.

9. A method of providing electrostatic discharge protection for an integrated circuit, comprising:

encapsulating at least part of an integrated circuit die mounted on a lead frame and a portion of the lead frame with a plastic or epoxy material, leaving lead portions and an electrostatic discharge protection portion of the lead frame unencapsulated; and folding the electrostatic discharge protection portion of the lead frame around the encapsulated integrated circuit die and over or adjacent to a surface of the plastic or epoxy material.

10. The method of claim 9, wherein the step of encapsulating at least part of an integrated circuit die mounted on a lead frame and a portion of the lead frame with a plastic or epoxy material, leaving lead portions and an electrostatic discharge protection portion of the lead frame unencapsulated further comprises:

forming the plastic or epoxy material over one surface and sidewalls of the integrated circuit die and over portions of a surface of the lead frame on which the integrated circuit die is mounted, leaving an opposite surface of the lead frame and the lead portions and the electrostatic discharge protection portion of the lead frame unencapsulated.

11. The method of claim 9, wherein the step of encapsulating at least part of an integrated circuit die mounted on a lead frame and a portion of the lead frame with a plastic or epoxy material, leaving lead portions and an electrostatic discharge protection portion of the lead frame unencapsulated further comprises:

leaving a contact surface of the integrated circuit die exposed.

12. The method of claim 9, further comprising:

mounting the integrated circuit die on a flat lead frame having the lead portions projecting from at least one edge and the electrostatic discharge protection portion projecting from at least one edge.

13. The method of claim 12, wherein the electrostatic discharge protection portion of the lead frame projects from an edge other than an edge from which the lead portions project.

14. The method of claim 12, wherein the electrostatic discharge protection portion of the lead frame projects from an edge from which the lead portions project, the electrostatic discharge protection portion extending around the lead portions and beyond ends of the lead portions.

15. The method of claim 12, wherein the electrostatic discharge protection portion of the lead frame projects from at least two opposing edges of the lead frame.

16. The method of claim 12, wherein the electrostatic discharge protection portion of the lead frame projects from at least three edges of the lead frame, including one edge from which the lead portions project.

17. A method of providing electrostatic discharge protection for an integrated circuit, comprising:

forming a flat lead frame having lead portions and an electrostatic discharge protection portion extending from edges thereof;

mounting an integrated circuit die on a surface of the lead frame and encapuslating the at least sides of the integrated circuit die and a portion of the lead frame surface on which the integrated circuit die is mounted with an encapsulating material, leaving the lead portions and the electrostatic discharge protection portion of the lead frame projecting beyond the encapsulating material;

folding the electrostatic discharge protection portion of the lead frame around one or more sides of the encapsulating material.

18. The method of claim 17, wherein the step of folding the electrostatic discharge protection portion of the lead frame around one or more sides of the encapsulating material further comprises:

folding the electrostatic discharge protection portion of the lead frame to extend along the sides of the encapsulating material; and folding the electrostatic discharge protection portion of the lead frame to extend over a periphery of a surface of the encapsulating material opposite the lead frame.

19. The method of claim 17, wherein the step of folding the electrostatic discharge protection portion of the lead frame around one or more sides of the encapsulating material further comprises:

folding the electrostatic discharge protection portion of the lead frame to extend along the sides of the encapsulating material; and folding the electrostatic discharge protection portion of the lead frame to extend adjacent to a surface of the encapsulating material opposite the lead frame.

20. The method of claim 17, wherein the step of folding the electrostatic discharge protection portion of the lead frame around one or more sides of the encapsulating material further comprises:

folding the electrostatic discharge protection portion of the lead frame around at least two opposing sides of the encapsulating material.

* * * * *